(12) United States Patent
Zhou et al.

(10) Patent No.: US 6,261,942 B1
(45) Date of Patent: Jul. 17, 2001

(54) DUAL METAL-OXIDE LAYER AS AIR BRIDGE

(75) Inventors: Mei Sheng Zhou; Simon Chooi; Xu Yi, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/490,156

(22) Filed: Jan. 24, 2000

(51) Int. Cl.$^7$ .................................. H01L 21/4763
(52) U.S. Cl. ..................... 438/619; 438/421; 438/422
(58) Field of Search ........................... 438/411, 421, 438/422, 619

(56) References Cited

U.S. PATENT DOCUMENTS

| | | | |
|---|---|---|---|
| 5,407,860 | 4/1995 | Stoltz et al. | 437/180 |
| 5,461,003 | 10/1995 | Havemann et al. | 437/187 |
| 5,744,399 | 4/1998 | Rostoker et al. | 438/622 |
| 5,750,415 | 5/1998 | Gnade et al. | 437/195 |
| 6,071,805 | * 6/2000 | Liu | 438/619 |
| 6,165,890 | * 12/2000 | Kohl et al. | 438/619 |

* cited by examiner

*Primary Examiner*—Charles Bowers
*Assistant Examiner*—David S. Blum
(74) *Attorney, Agent, or Firm*—George O. Saile; Rosemary L. S. Pike

(57) ABSTRACT

A method for introducing air into the gaps between neighboring conducting structures in a microelectronics fabrication in order to reduce the capacitative coupling between them. A patterned metal layer is deposited on a substrate. The layer is lined with a CVD-oxide. A disposable gap-filling material is deposited over the lined metal layer. A two layer "air-bridge" is formed over the gap-fill by depositing a layer of TiN over a layer of CVD-oxide. This structure is rendered porous by several chemical processes. An oxygen plasma is passed through the porous air-bridge to react with and dissolve the gap-fill beneath it. The reaction products escape through the porous air-bridge resulting in air-filled gaps.

51 Claims, 4 Drawing Sheets

DUAL METAL-OXIDE LAYER AS AIR BRIDGE

BACKGROUND OF THE INVENTION

1. Field of the Invention

This invention relates generally to the fabrication of semiconductor devices and more specifically to a method for reducing the dielectric constant of materials used to separate conducting leads and structures in those devices.

2. Description of the Related Art

As the size of integrated microelectronic circuits continues to shrink, conducting structures and leads fabricated within those circuits must be positioned in closer proximity to each other both horizontally and vertically. This introduces the problem of intra-wall capacitative coupling between those structures and leads, which both adversely affects the time dependence of electrical signals (eg by producing increased RC delay in metallic interconnects) and produces crosstalk between nearby portions of the circuit. One way to reduce the capacitative coupling is to lower the dielectric constant of the material used to separate the conducting leads and structures from each other. The dielectric material most commonly used to separate these leads and structures is silicon dioxide, which has a dielectric constant of approximately 3.9. Vacuum, which is the ideal, perfect dielectric, has a dielectric constant of exactly unity (1.000), while air, at atmospheric pressure, has a dielectric constant of 1.00059.

The predominant present art utilizes silicon dioxide dielectrics, deposited either by chemical vapor deposition (CVD-oxide) or by means of plasma assisted deposition (HDP-oxide). These dielectrics have a resulting dielectric constant of between 3 and 4.

In an alternative form of the present art, dielectrics with lower dielectric constants than that of silicon dioxide are deposited. These dielectrics are typically spin-coated or CVD deposited on a thin liner of silicon dioxide that is first deposited over the conducting structures. Examples of this present practice include spin-coating of a non-porous polymer (eg. FLARE, a proprietary material having a dielectric constant between 2.5 and 3.0, manufactured by Allied Signal Corp.). Alternatively, various porous materials can be spin-coated (eg. Xerogel or Nanofoam, manufactured by Allied Signal Corp.), attaining lower dielectric constants, which still exceed 1.5. Other materials can be deposited by CVD (eg. Black Diamond, manufactured by Applied Materials Corp. and Coral, manufactured by Novellus Corp.), but these still have dielectric constants of between 2.5 and 3.

More recent attempts to reduce the dielectric constant have produced methods that introduce air into the gap-filling dielectric material or totally replace the gap-filling material with air. One such method (Havemann et al., U.S. Pat. No. 5,461,003) involves deposition of a disposable solid material as a temporary gap-fill, covering said material with a porous layer, then dissolving the material and allowing it to escape through the porous layer, leaving behind air-filled gaps. Another method (Gnade et al., U.S. Pat. No. 5,750,415) involves the deposition of a disposable liquid over conducting leads. A porous film of silica is deposited over the liquid and then gelled, to lower its porosity. The disposable liquid is then removed through the silica gel. The method of Stoltz et al. (U.S. Pat. No. 5,407,860) first deposits a non-wetting material over conducting leads and the exposed substrate surfaces between them. The nonwetting material is then selectively removed from the tops of the leads and the substrate surface, but is left on the sides of the leads. A dielectric material subsequently deposited over the leads does not enter the spaces between the leads, leaving them filled with air. Finally, the method of Rostoker et al. (U.S. Pat. No. 5,744,399) forms a porous dielectric gap-filling layer of low dielectric constant by using a composite material comprising a matrix-forming material and a fullerene. When the fullerene is subsequently removed from its matrix by dissolution, it leaves behind air-filled voids within the matrix.

The present invention is a method for introducing air into the gaps between adjacent conducting structures by extracting a disposable gap-filling material through a novel air-bridge structure. The formation of this structure as an integral part of the fabrication process and the subsequent manner of its use, makes the present invention different from the other inventions described above.

SUMMARY OF THE INVENTION

The object of this invention is to provide a method for reducing the capacitative coupling between conducting structures such as metallic leads and interconnects in a microelectronics fabrication by introducing air into the gaps between them. This object is achieved by a method comprising the formation of a novel air-bridge structure over a disposable, reactive, gap-filling material, the dissolution of said disposable gap-filling material through the air-bridge and the subsequent escape of its reaction products through said air-bridge, leaving air-filled gaps behind.

DESCRIPTION OF THE PREFERRED EMBODIMENTS

The present invention is a method for introducing air into the gaps between neighboring conducting structures in a microelectronics fabrication. A first preferred embodiment of this invention will be described by referring to a series of figures labeled FIG. 1, FIG. 2, FIG. 3, FIG. 4, FIG. 5, FIG. 5A, FIG. 6, FIG. 6A, FIG. 7 and FIG. 8. A second preferred embodiment will be described with reference to FIG. 9.

Figure 1:
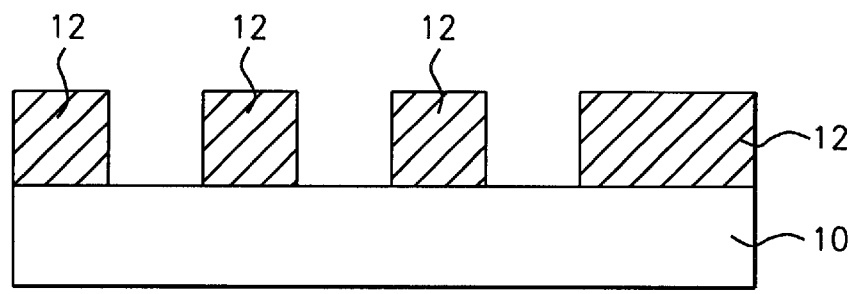
FIG. 1 shows the cross-section of a substrate, which can be a quartz substrate or a substrate already containing a microelectronics fabrication, upon which has been deposited a pattern of conducting leads, which could be aluminum-copper or copper interconnects. The simplicity of the pattern is for descriptive purposes only and is not meant to limit the method of the invention to a particular set of structures.

Referring first to FIG. 1, there is shown a cross-sectional view of a substrate (10), on which has been deposited a pattern of separated conducting structures (12). The substrate may be a semiconductor substrate, a dielectric substrate, a quartz substrate or a microelectronics fabrication upon which a subsequent fabrication is to occur. The pattern of conducting structures may be devices or portions of devices, or metallic leads and interconnects that comprise one or more of the following: Ti, TiN, TiW, AlCu, tungsten or copper leads and interconnects. A typical interconnect lead in the present invention would consist of titanium nitride (TiN) as an anti-reflective coating (ARC), aluminum-copper, titanium nitride and titanium. These structures and leads could have heights of between 5000 angstroms and 12,000 angstroms and widths of between 0.2 microns and 1000 microns and the spaces between them could have widths of between 0.2 microns and 1000 microns.

Figure 2:
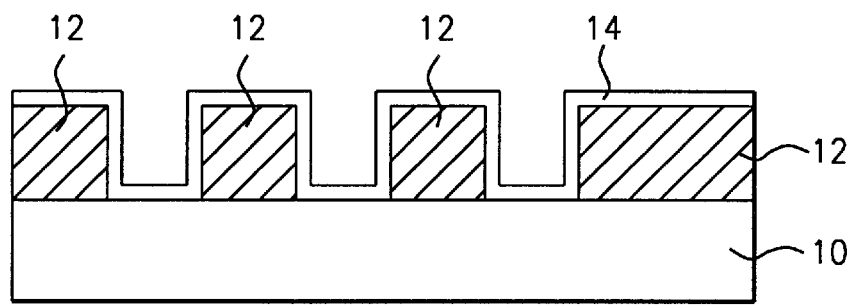
FIG. 2 shows the same substrate and conducting pattern of FIG. 1, over which a layer of silicon dioxide has been deposited to act as a liner.

FIG. 2 shows the fabrication of FIG. 1, after the deposition of a liner layer (14) such as silicon dioxide, deposited to a thickness of between 100 angstroms and 2000 angstroms by a process of chemical vapor deposition (CVD).

Figure 3:
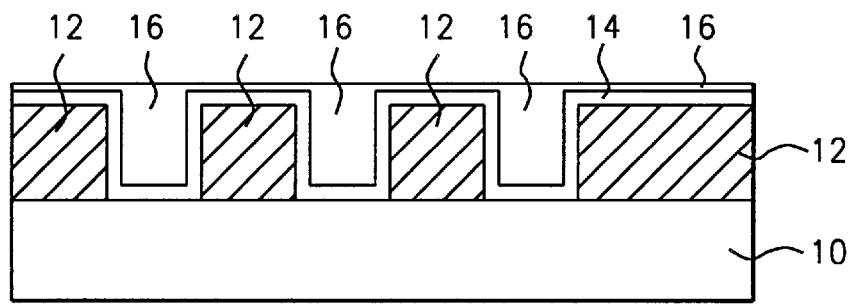
FIG. 3 shows the same fabrication of FIG. 2, over which has been deposited a disposable, gap-filling material, which could be a flowable, reactive, organic material.

FIG. 3 shows the fabrication of FIG. 2, after the deposition of a disposable, reactive, gap-filling material (16) over the pattern of conducting structures. This material fills the gaps and rises to at least the height of the conducting structures or slightly above that height, so as to coat their upper surfaces as well. The gap-filling material could be a flowable, organic, reactive material, such as FLARE (manufactured by the Allied Signal Corp.), SiLK (manufactured by Dow Chemical Corp.), or buckminsterfullerene (C60, C70 and C80).

Figure 4:
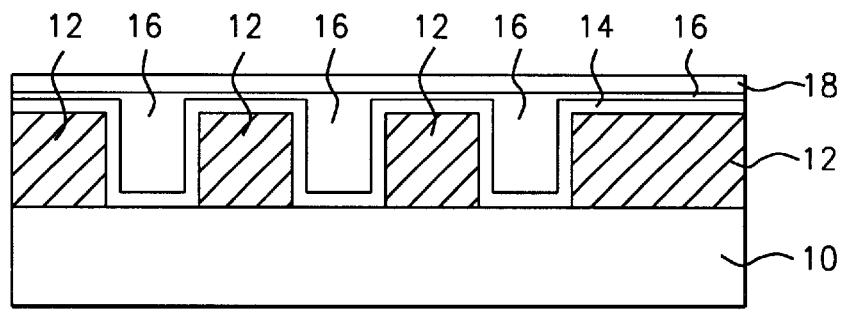
FIG. 4 shows the same fabrication of FIG. 3, over which has been deposited a first material layer, which could be a layer of silicon dioxide deposited by chemical vapor deposition.

FIG. 4 shows the fabrication of FIG. 3, wherein a first material layer (18) has been deposited on the gap-filling material. This material layer could be a layer of CVD silicon dioxide or a layer of silicon oxynitride, or a layer of doped silicon dioxide such as BPSG or PSG, deposited to a thickness of between 50 angstroms and 2000 angstroms. This first material layer will comprise the first layer of a two layer air-bridge structure to be discussed below.

Figure 5:
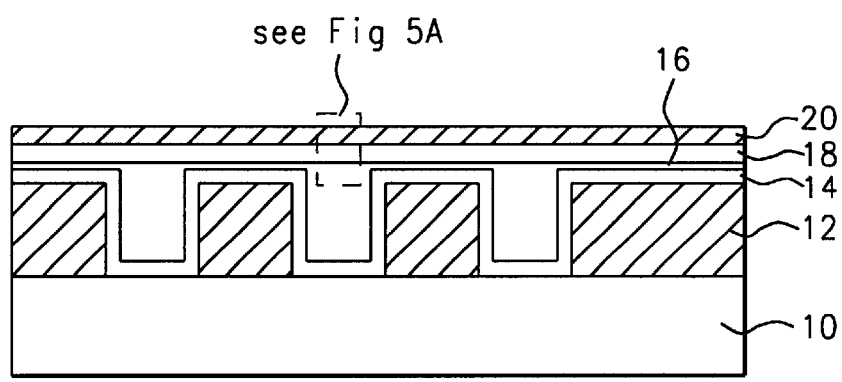
FIG. 5 shows the same fabrication of FIG. 4, with a second material layer now deposited on the first material layer. This second material layer can be a metallic layer consisting of TiN, or it can be a metallic bilayer consisting of Ti/TiN.

FIG. 5 shows the fabrication of FIG. 4, with the deposition of a second material layer (20) on the first layer (18). The second layer can be a layer of TiN deposited to a thickness of between 50 angstroms and 2000 angstroms or a TiN/Ti bilayer, deposited to a total thickness of between 50 angstroms and 2000 angstroms. This second layer completes the air-bridge structure.

Figure 5A:
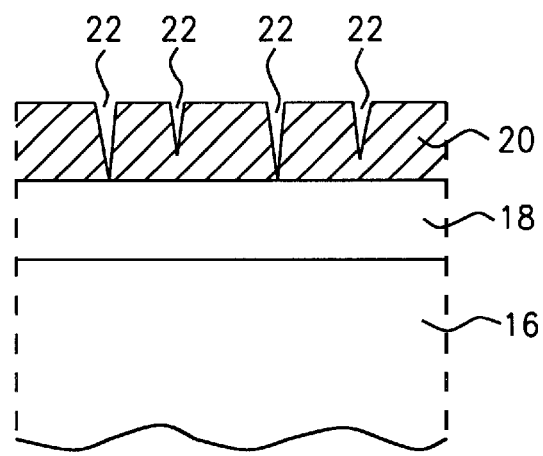
FIG. 5A shows a magnified view of a small portion of the fabrication in FIG. 5. This magnified view shows the pinholes and pores that form naturally in deposited TiN layers and TiN/Ti bilayers.

FIG. 5A is a magnification of a small region delineated in FIG. 5. It shows clearly pinholes and pores whose widths range between 20 angstroms and 100 angstroms and whose formation is inherent in the deposition process of the TiN layer or TiN/Ti bilayer. The exploitation of these cracks and pores is what gives the air-bridge structure its unique role in this invention.

Figure 6:
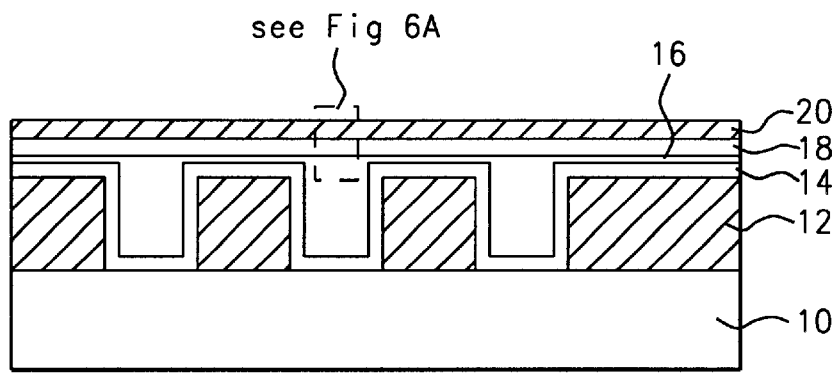
FIG. 6 shows the fabrication of FIG. 5, wherein the second material layer has been subjected to a chemical process that extends and enlarges its pinholes and pores.

FIG. 6 shows the fabrication of FIG. 5 after the second material layer (20) has been subjected to a pore-enhancing chemical process that enlarges and extends the pinholes and pores into the first material layer. Said process could be a wet-process application of a developer solution, such as tetramethylammonium hydroxide (TMAH) or tetraethylammonium hydroxide (TEAH), or a dry etching process utilizing fluorocarbon chemistries (eg. $CF_4$ or $CF_4/CHF_3$). In the application of the fluorocarbon chemistry it is expected that some of the titanium nitride would be etched.

Figure 6A:
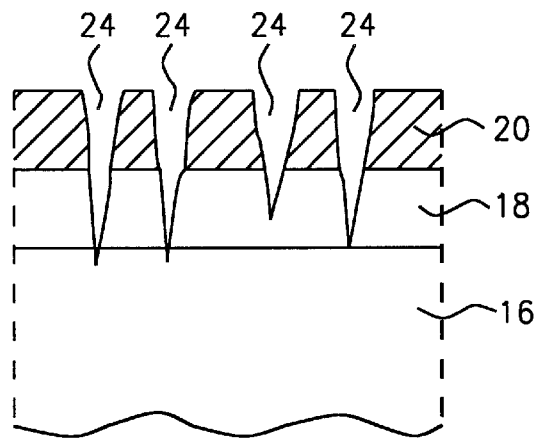
FIG. 6A shows a magnified view of a small portion of the fabrication in FIG. 6. The enlarged pinholes and pores produced by the chemical process have penetrated into the first material layer, rendering it porous.

FIG. 6A is a magnification of a small region delineated in FIG. 6. It shows the effects of the pore-enhancement in the second material layer (20). The pinholes and pores have been enlarged and are extended into and through the first material layer (18) and even into the disposable gap-filling material (16).

Figure 7:
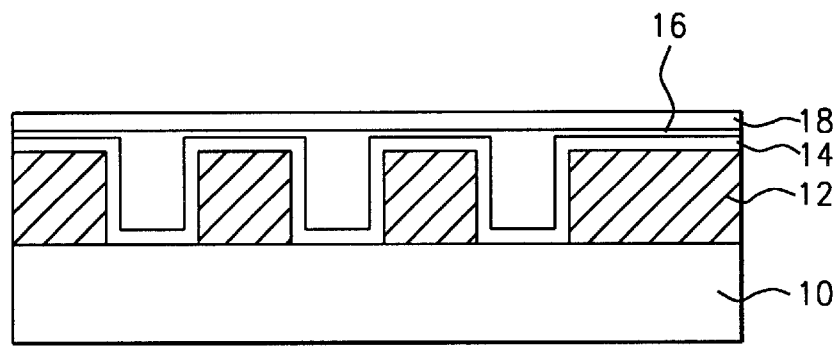
FIG. 7 shows the fabrication of FIG. 6, wherein the second material layer has been removed.

FIG. 7 shows the fabrication of FIG. 6 after the second material layer has been removed by a blanket etching process that utilizes chlorine based chemistry, such as $BCl_3/Cl_2$ or $BCl_3/Cl_2/N_2$ or chlorine. This etching process has a TiN:oxide selectivity greater than 3:1. Another result of this etching process is to enlarge the pores and cracks in the remaining CVD-oxide layer (18) and even those that have entered the gap-filling material (16).

Figure 8:
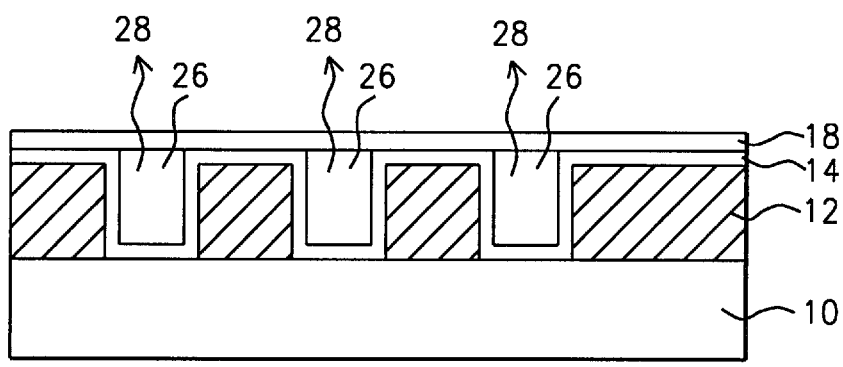
FIG. 8 shows the fabrication of FIG. 7, which has now been subjected to an oxygen plasma etch in order to dissolve the disposable gap-filling material beneath the first material layer. The reaction products of the disposable gap-filling material diffuse out through the porous layer and leave behind gaps that are air-filled.

Finally, FIG. 8 shows the fabrication after application of an anisotropic oxygen plasma to the surface of the CVD-oxide layer (18). The plasma passes through the pores in this layer and reacts with the disposable gap-filling material below it (16). The gap-filling material forms carbon dioxide, carbon monoxide and water vapor with the oxygen radicals and the reaction products diffuse out (28) through the CVD-oxide layer, leaving air-filled gaps (26) in its place.

Figure 9:
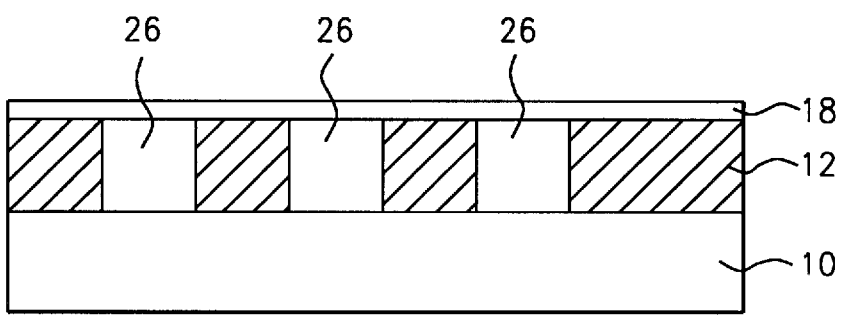
FIG. 9 shows the equivalent stage of the fabrication as in FIG. 8, but now done according to a second preferred embodiment of the invention in which the layer lining the conducting structures (first shown in FIG. 2) has been omitted.

A second preferred embodiment of the present invention comprises all of the steps described in the first preferred embodiment, with the exception of the deposition of a liner layer described in FIG. 2 and indicated in subsequent figures as (14). All succeeding steps described in FIGS. 3 through 8 proceed identically. FIG. 9 shows the final fabrication as it appears without the liner layer, with the air-filled gaps indicated as (26) and the first material layer (18) deposited directly on the conducting structures (12).

As is finally understood by a person skilled in the art, the preferred embodiments of the present invention are illustrative of the present invention rather than limiting of the present invention. Revisions and modifications may be made to the methods, materials, structures and dimensions through which air is introduced into the gaps between adjacent conducting structures in a microelectronics fabrication in accord with the preferred embodiments of the present invention, while still introducing air into the gaps between adjacent conducting structures in a microelectronics fabrication in accord with the present invention as provided by the appended claims.

What is claimed is:

1. A method for introducing air into the gaps between adjacent conducting structures in a microelectronics fabrication comprising:

depositing a patterned conducting layer on a substrate;

forming a liner layer of thickness between 100 angstroms and 2000 angstroms on all exposed surfaces of the conducting layer and substrate;

depositing a disposable gap-filling material on said liner layer so that the gap-filling material fills all gaps between adjacent conducting structures and rises to at least the level of the top surfaces of the liner where it covers the tops of the conducting structures;

depositing a first material layer over said disposable gap-filling material;

depositing a second material layer over said first material layer;

exposing said second material layer to a first chemical process;

removing said second material layer by a second chemical process;

exposing the first material layer to a reactive plasma, which penetrates said layer and reacts with the disposable gap-filling material beneath it;

dissolving the disposable gap-filling material through its reaction with the plasma;

removing the reaction products of the dissolved disposable gap-filling layer by diffusion through the first material layer, leaving the gaps filled with air.

2. The method of claim 1 wherein the substrate is a quartz substrate.

3. The method of claim 1 wherein the substrate is a semiconductor substrate.

4. The method of claim 1 wherein the substrate is an insulating substrate.

5. The method of claim 1 wherein the substrate is itself a microelectronics fabrication.

6. The method of claim 1 wherein the patterned conducting layer is a metallic conducting layer.

7. The method of claim 6 wherein the patterened conducting layer contains adjacent leads and interconnects.

8. The method of claim 7 wherein the leads and interconnects are aluminum-copper leads and interconnects.

9. The method of claim 7 wherein the leads and interconnects are copper leads and interconnects.

10. The method of claim 7 wherein the leads and interconnects are tungsten leads and interconnects.

11. The method of claim 7 wherein the leads and interconnects are titanium nitride (TiN) leads and interconnects.

12. The method of claim 7 wherein the leads and interconnects are Ti leads and interconnects.

13. The method of claim 7 wherein the leads and interconnects are TiW leads and interconnects.

14. The method of claim 7 wherein the leads and interconnects are a combination including all or at least one of the metallic substances in claims 8 through 13.

15. The method of claim 1 wherein the liner layer is a CVD-oxide layer formed to a thickness of between 100 angstroms and 2000 angstroms.

16. The method of claim 1 wherein the disposable gap-filling material is a flowable, reactive, organic material.

17. The method of claim 16 wherein the disposable gap-filling material is a material such as FLARE (manufactured by the Allied Signal Corp.), SiLK (manufactured by Dow Chemical Corp.), or buckminsterfullerene (C60, C70 and C80).

18. The method of claim 1 wherein the first material layer is a CVD-oxide layer formed to a thickness of between 50 angstroms and 2000 angstroms.

19. The method of claim 1 wherein the second material layer is a TiN layer formed to a thickness of between 50 angstroms and 1000 angstroms.

20. The method of claim 1 wherein the second material layer is a TiN/Ti bilayer, formed to a thickness of between 50 angstroms and 1000 angstroms.

21. The method of claim 1 wherein the first chemical process is a pore-enhancement process.

22. The method of claim 21 wherein the pore-enhancement process is a wet-process developer application of tetramethyammonium hydroxide (TMAH).

23. The method of claim 21 wherein the pore-enhancement process is a wet-process developer application of tetraethylammonium hydroxide (TEAH).

24. The method of claim 21 wherein the pore-enhancement process is a dry-etch process involving the application of fluorocarbon chemistries.

25. The method of claim 1 wherein the second chemical process is a selective chemical etch using $BCl_3/Cl_2$.

26. The method of claim 1 wherein the reactive plasma is an oxygen plasma.

27. A method for introducing air into the gaps between adjacent conducting structures in a microelectronics fabrication comprising:

depositing a patterned conducting layer on a substrate;

depositing a disposable gap-filling material on said patterned conducting layer so that the gap-filling material fills all gaps between adjacent conducting structures and rises to at least the level of the top surfaces of the conducting structures;

depositing a first material layer over said disposable gap-filling material;

depositing a second material layer over said first material layer;

exposing said second material layer to a first chemical process;

removing said second material layer by a second chemical process;

exposing the first material layer to a reactive plasma, which penetrates said layer and reacts with the disposable gap-filling material beneath it;

dissolving the disposable gap-filling material through its reaction with the plasma;

removing the reaction products of the dissolved disposable gap-filling layer by diffusion through the first material layer, leaving the gaps filled with air.

28. The method of claim 27 wherein the substrate is a quartz substrate.

29. The method of claim 27 wherein the substrate is a semiconductor substrate.

30. The method of claim 27 wherein the substrate is an insulating substrate.

31. The method of claim 27 wherein the substrate is itself a microelectronics fabrication.

32. The method of claim 27 wherein the patterned conducting layer is a metallic conducting layer.

33. The method of claim 32 wherein the patterned conducting layer contains adjacent leads and interconnects.

34. The method of claim 33 wherein the leads and interconnects are aluminum-copper leads and interconnects.

35. The method of claim 33 wherein the leads and interconnects are copper leads and interconnects.

36. The method of claim 33 wherein the leads and interconnects are tungsten leads and interconnects.

37. The method of claim 33 wherein the leads and interconnects are TiN leads and interconnects.

38. The method of claim 33 wherein the leads and interconnects are Ti leads and interconnects.

39. The method of claim 33 wherein the leads and interconnects are TiW leads and interconnects.

40. The method of claim 33 wherein the leads and interconnects are a combination including all or at least one of the metallic substances in claims 34 through 39.

41. The method of claim 27 wherein the disposable gap-filling material is a flowable, reactive, organic material.

42. The method of claim 41 wherein the disposable gap-filling material is a material such as FLARE (manufactured by the Allied Signal Corp.), SiLK (manufactured by Dow Chemical Corp.), or buckminsterfullerene (C60, C70 and C80).

43. The method of claim 27 wherein the first material layer is a CVD-oxide layer formed to a thickness of between 100 angstroms and 2000 angstroms.

44. The method of claim 27 wherein the second material layer is a TiN layer formed to a thickness of between 50 angstroms and 1000 angstroms.

45. The method of claim 27 wherein the second material layer is a TiN/Ti bilayer, formed to a thickness of between 50 angstroms and 2000 angstroms.

46. The method of claim 27 wherein the first chemical process is a pore-enhancement process.

47. The method of claim 46 wherein the pore-enhancement process is a wet-process developer application of tetramethyammonium hydroxide (TMAH).

48. The method of claim 46 wherein the pore-enhancement process is a wet-process developer application of tetraethylammonium hydroxide (TEAH).

49. The method of claim 46 wherein the pore-enhancement process is a dry-etch process involving the application of fluorocarbon chemistries.

50. The method of claim 27 wherein the second chemical process is a selective chemical etch using $BCl_3/Cl_2$.

51. The method of claim 27 wherein the reactive plasma is an oxygen plasma.

* * * * *